United States Patent
Hanneman

[19]

[11] Patent Number: 5,999,108

[45] Date of Patent: *Dec. 7, 1999

[54] AVIONICS DISPLAY POINTER SENSOR

[76] Inventor: Charles K. Hanneman, 9105 - Grant La., Overland Park, Johnson County, Kans. 66212

[*] Notice: This patent issued on a continued prosecution application filed under 37 CFR 1.53(d), and is subject to the twenty year patent term provisions of 35 U.S.C. 154(a)(2).

[21] Appl. No.: 08/747,293

[22] Filed: Nov. 12, 1996

Related U.S. Application Data

[60] Provisional application No. 60/022,468, Jul. 5, 1996.

[51] Int. Cl.$^6$ ................................................. G08B 21/00
[52] U.S. Cl. ........................... 340/945; 73/1.01; 116/288; 324/130; 364/571.01
[58] Field of Search .................................. 340/461, 945, 340/971; 116/288, 291, 292; 324/601, 130; 364/571.01; 73/1.01, 1.37, 1.75

[56] References Cited

U.S. PATENT DOCUMENTS

| | | | |
|---|---|---|---|
| 3,683,254 | 8/1972 | Masse et al. | 318/608 |
| 3,751,642 | 8/1973 | Todd et al. | 73/229 |
| 4,300,548 | 11/1981 | Jones | 73/705 |
| 4,879,510 | 11/1989 | Itoh | 324/150 |
| 4,988,944 | 1/1991 | Ito | 324/154 PB |
| 5,359,284 | 10/1994 | Hawes et al. | 324/164 |
| 5,410,244 | 4/1995 | Draves | 324/74 |
| 5,489,842 | 2/1996 | Lippmann et al. | 324/144 |
| 5,584,763 | 12/1996 | Kelly et al. | 463/16 |
| 5,644,337 | 7/1997 | Stacy | 345/167 |
| 5,724,257 | 3/1998 | Gerosa et al. | 73/805 |

FOREIGN PATENT DOCUMENTS

| | | |
|---|---|---|
| 0 473 883 | 3/1992 | European Pat. Off. . |
| 0 644 402 | 3/1995 | European Pat. Off. . |
| 195 24 879 | 1/1996 | Germany . |
| 04 240521 | 8/1992 | Japan . |
| 2 173 898 | 10/1986 | United Kingdom . |

*Primary Examiner*—Brent A. Swarthout

[57] ABSTRACT

A display apparatus (10) having a display (12) including indicia representative of a measured parameter, an indicator (13) shiftable relative to the display, and a control assembly (14) for controlling the positioning of the indicator relative to the display. The control assembly includes a microprocessor (16) for receiving navigational signals and for converting the navigational signals to control signals and a stepper motor (18) responsive to the microprocessor for driving the indicator in response to the control signals. The control assembly also includes an indicator position sensor (20) for determining the actual position of the display indicator and for generating position signals representative of this actual position. The microprocessor uses these position signals for calibrating the stepper motor.

27 Claims, 2 Drawing Sheets

AVIONICS DISPLAY POINTER SENSOR

This application claims priority from U.S. provisional application Ser. No. 60/022,468, filed Jul. 5, 1996.

BACKGROUND OF THE INVENTION

1. Field of the Invention

The present invention relates to navigation displays for use in aircraft navigation systems. More particularly, the invention relates to a navigation display having an indicator position sensor.

2. Description of the Prior Art

Avionics displays must be precisely aligned and calibrated to insure accurate indication of the position, heading, glide slope or other navigational parameter of the aircraft. The displays must also be mechanically, electrically, and magnetically linear.

Avionics displays are typically aligned and calibrated during their manufacture. Unfortunately, the alignment and linearity of avionic displays can change over time due to many factors, resulting in inaccurate display readings.

Prior art avionics displays do not include systems for checking the alignment and linearity of the displays once they are installed in an aircraft. Thus, pilots cannot accurately determine when a display's reading is inaccurate.

Additionally, prior art avionics displays are not self-calibrating. Thus, when the alignment or linearity of a display changes, the display must be removed from the aircraft and re-calibrated or replaced with a new display. Those skilled in the art will appreciate that both of these options are expensive and time-consuming.

SUMMARY OF THE INVENTION

The present invention solves the above-described problems and provides a distinct advance in the art of avionics displays. More particularly, the present invention provides a display apparatus that can be easily and quickly aligned and calibrated either during manufacture or after it has been installed.

The display apparatus of the present invention broadly includes a display including indicia representative of a measured parameter, an indicator shiftable relative to the display, and a control assembly for controlling the positioning of the indicator. The control assembly includes processor means, indicator shifting means, and indicator position sensing means.

The processor means receives a parameter signal from a navigation receiver or other parameter measuring device and generates a control signal representative of the parameter signal. The indicator shifting means is coupled with the processor means for shifting the indicator relative to the display in response to the control signal to indicate the measured parameter.

The indicator position sensing means senses the actual position of the indicator relative to the display, generates a position signal representative of this actual position, and transmits the position signal to the processor means. The processor means compares the position signal to alignment information determined during the initial calibration of the display apparatus to determine whether the indicator shifting means and the indicator are out of alignment. If they are out of alignment, the processor means uses the position signal to re-calibrate the display apparatus.

In preferred forms, the indicator position sensing means includes a source, a pickup, and an interrupting body. The source and pickup pair are positioned in the path of travel of the indicator. The source transmits a source signal, and the pickup receives the source signal and generates a corresponding position signal in response thereto.

The interrupting body is coupled for movement with the indicator and is positioned for passing between the source and the pickup when the indicator sweeps across the display. The interrupting body interrupts or changes the magnitude of the source signal received by the pickup and therefore alters the position signal generated by the pickup. In preferred forms, the interrupting body is configured to interrupt different amounts of the source signal as the indicator is shifted across the display. This changes the position signal as a function of the indicator position so that the exact position of the indicator relative to the display can be detected.

BRIEF DESCRIPTION OF THE DRAWING FIGURES

A preferred embodiment of the present invention is described in detail below with reference to the attached drawing figures, wherein.

DETAILED DESCRIPTION OF THE PREFERRED EMBODIMENTS

Figure 1:
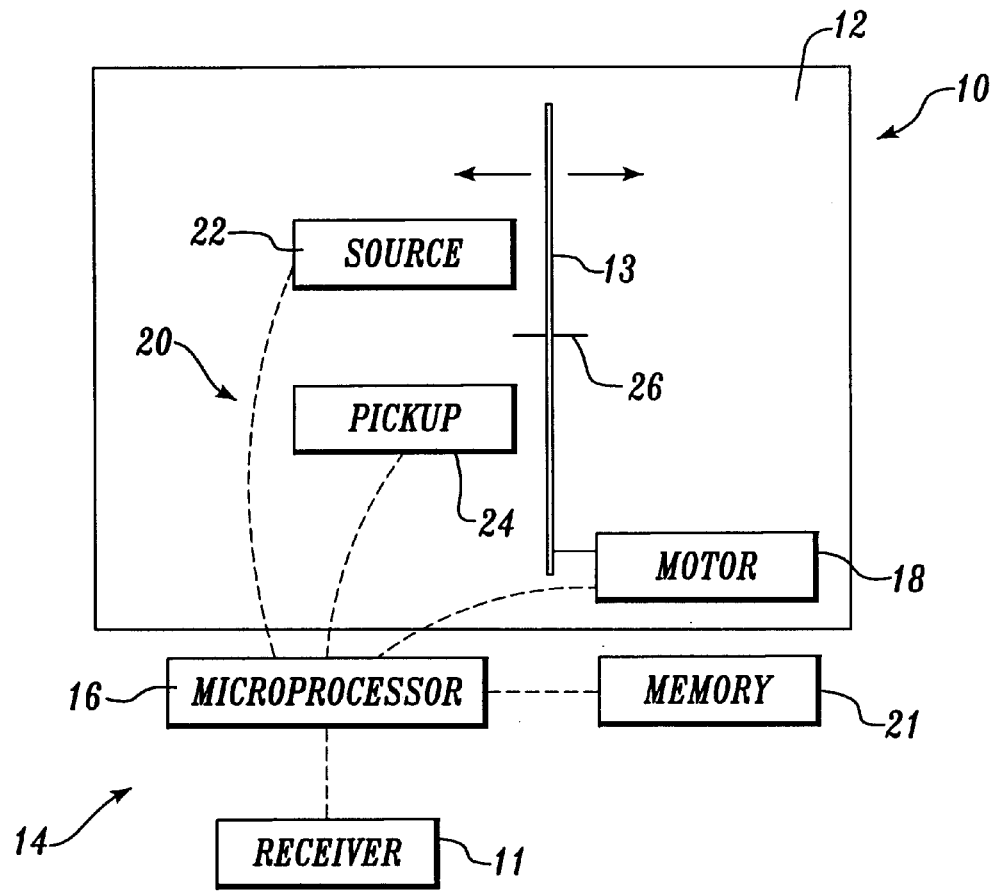
FIG. 1 is a schematic diagram of a display apparatus constructed in accordance with a first embodiment of the invention.

Display apparatus 10 constructed in accordance with a first embodiment of the invention is illustrated in FIG. 1. Display apparatus 10 is preferably configured for use in an aircraft navigation system having a conventional aircraft navigation receiver 11 such as a VHF Omninavigation Receiver (VOR), Automatic Direction Finder (ADF), or Omni Bearing Selector (OBS) that is operable for receiving navigation signals from ground-based navigation transmitters. The navigation signals may include position signals, heading signals, glide slope signals or other conventional signals. Those skilled in the art will appreciate that display apparatus 10 may also be used in other parameter measuring systems having parameter measuring devices that generate parameter signals representative of a measured parameter.

Display apparatus 10 broadly includes display 12, indicator 13 shiftable relative to display 12, and control assembly broadly referred to by the numeral 14 for controlling the positioning of the indicator. The components of display apparatus 10 are preferably housed within a plastic or other non-magnetic enclosure similar to those used for conventional avionics displays.

In more detail, display 12 is conventional and includes indicia representative of the parameter measured by receiver 11 or other parameter measuring device. For example, display 12 may include indicia representative of the position, heading, or glide slope of an aircraft.

Indicator 13 is shiftably mounted relative to display 12 for indicating the measured parameter represented by the parameter signal. Indicator 13 may be any conventional indicating device such as a pointer needle. Indicator 13 may shift from side-to-side across display 12 or may be pivotally connected to the display to sweep across an arc on the display.

Control assembly 14 preferably includes microprocessor 16, stepper motor 18, and an indicator position sensor broadly referred to by the numeral 20. The components of control assembly 14 are electrically coupled by conventional wiring illustrated by the dashed lines in FIG. 1 and may be housed within the same enclosure as the other components of display apparatus 10 or attached to a circuit board mounted adjacent the display apparatus.

Microprocessor 16 is coupled with navigation receiver 11 or a similar parameter measuring device. Microprocessor 16 receives the parameter signals generated by receiver 11 and converts the parameter signals to a control signal representative of the parameter signals for driving the stepper motor 18 as described below.

Microprocessor 16 is also coupled with indicator position sensor 20 for receiving indicator position signals from the sensor. Microprocessor 16 uses these indicator position signals for calibrating its control signal and stepper motor 18 as described below.

Microprocessor 16 may be any conventional processing device such as a Model No. MC68HC05B6 microprocessor manufactured by Motorola. As illustrated in FIG. 1, microprocessor 16 includes memory device 21 such as a conventional non-volatile solid-state memory chip for storing alignment and calibration information as discussed below.

Stepper motor 18 is operably coupled between indicator 13 and microprocessor 16 for driving the indicator in response to the control signal generated by the microprocessor. Stepper motor 18 receives the control signal and shifts indicator 13 relative to the display in response thereto to indicate the measured parameter. In preferred forms, stepper motor 18 is operably coupled with indicator 13 by a gear train (not shown) for reducing the speed of the indicator relative to the speed of the stepper motor drive shaft.

Stepper motor 18 may be any conventional stepper motor such as the Model No. 148-05053-0000 stepper motor manufactured by Allied Signal Avionics, Inc. of Olathe, Kans. Those skilled in the art will appreciate that indicator 13 may also be shifted relative to display 12 by other conventional shifting devices such as a D'Arsonval type magnet and coil assembly.

Indicator position sensor 20 senses the actual position of indicator 13 relative to display 12 and generates an indicator position signal representative of this actual position. Sensor 20 transmits the position signal to microprocessor 16, which uses the position signal to determine whether stepper motor 18 and indicator 13 are out of alignment and to calibrate the stepper motor if they are.

The preferred indicator position sensor 20 includes source 22, pickup 24, and interrupting body 26. Source 22 is preferably a conventional optical or infrared transmitter operable for transmitting an optical or infrared source signal. Pickup 24 is preferably a corresponding optical or infrared receiver operable for receiving the optical or infrared source signal and for generating the indicator position signal in response thereto.

Alternatively, source 22 may be a conventional magnet that emits a magnetic field, and pickup 24 may be a Hall-effect type magnetic receiver that senses the magnetic field and generates the indicator position signal in response thereto. Source 22 and pickup 24 may also be replaced with a mechanical position sensing device.

Source 22 and pickup 24 are positioned within the path of travel of indicator 13 and are spaced a short distance from one another. Source 22 transmits the source signal in the direction of pickup 24, and pickup 24 normally receives the source signal and generates the indicator position signal in response thereto. Display apparatus 10 may include a plurality of sources and pickups placed at several locations along the path of travel of indicator 13 for sensing the actual position of indicator 13 as it passes these locations.

Interrupting body 26 is coupled for movement with indicator 13 and is positioned for passing between source 22 and pickup 24 when indicator 13 sweeps across display 12. Interrupting body 26 interrupts or changes the magnitude of the source signal received by pickup 24 and therefore alters the indicator position signal generated by the pickup.

If source 22 and pickup 24 are optical or infrared transmitters and receivers, interrupting body 26 is preferably an opaque shield attached near the center of indicator 13 and configured for passing between source 22 and pickup 24 as indicator 13 passes thereby. When interrupting body 26 passes between source 22 and pickup 24, it blocks the optical or infrared source signal and temporarily changes the indicator position signal generated by the pickup.

If source 22 and pickup 24 are a magnet and a magnetic field sensor, interrupting body 26 is preferably a metallic body configured to change the characteristics of the magnetic field sensed by the pickup as it passes between the source and pickup.

After pickup 24 transmits its indicator position signal to microprocessor 16, the microprocessor determines the actual position of indicator 13 by analyzing the magnitude or other characteristic of the position signal. For example, if interrupting body 26 is centered between source 22 and pickup 24, it will block or interrupt most or all of the source signal received by the pickup. As a result, pickup 24 will generate an indicator position signal of low or no magnitude. Microprocessor 16 determines from this position signal that indicator 13 is between source 22 and pickup 24. Microprocessor 16 uses this information to calibrate indicator 13 and stepper motor 18 as described in more detail below.

Figure 2:
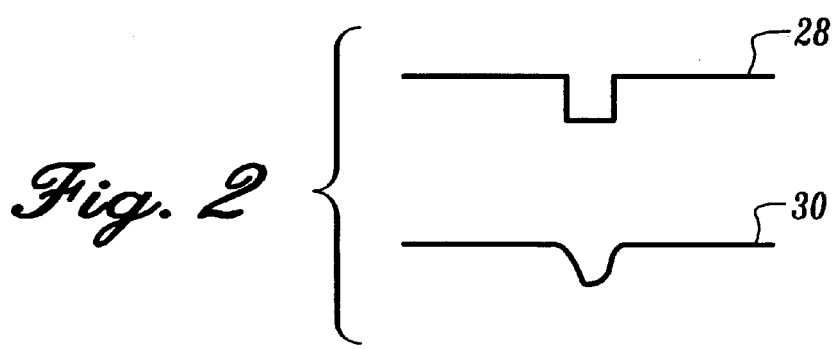
FIG. 2 is a graph illustrating sample indicator position signals generated by the indicator position sensing means of the display apparatus illustrated in FIG. 1.

FIG. 2 illustrates sample indicator position signals generated by pickup 24. Signal 28 is a digital signal that drops to "0" or logic-low whenever interrupting body 26 passes between source 22 and pickup 24. Signal 30 is an analog signal that gradually drops as interrupting body 26 passes between source 22 and pickup 24.

To insure that display apparatus 10 is properly aligned, it is important to sense the position of indicator 13 as it passes the center of display 12. Accordingly, it is advantageous to place source 22 and pickup 24 at the exact mid-point of display 12. However, those skilled in the art will appreciate that it is difficult to place source 22 and pickup 24 at the exact center location of display 12.

Display apparatus 10 solves this problem. Specifically, indicator position sensor 20 and microprocessor 16 cooperate to determine the position of indicator 13 as it passes the center of display 12 without placing source 22 and pickup 24 at the exact center position of display 12.

To accomplish this, source 22 and pickup 24 can be placed anywhere within the path of travel of indicator 13. The distance between the source 22 and pickup 24 and the mid-point of display 12 is then measured by conventional means. This measurement is stored as an offset value in memory 21 of microprocessor 16. Then, when microprocessor 16 receives the indicator position signal from pickup 24, it adds or subtracts the offset value from the position signal to account for the displacement of the source 22 and pickup 24 from the center of display 12.

Figure 3:
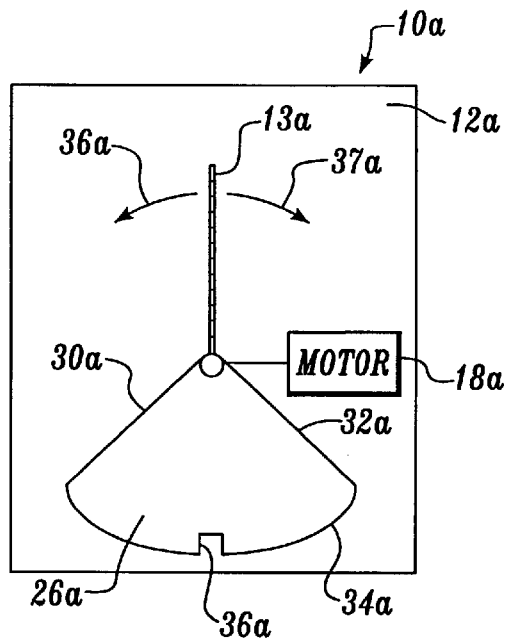
FIG. 3 is a schematic plan view of a display apparatus constructed in accordance with a second embodiment of the invention.
Figure 4:
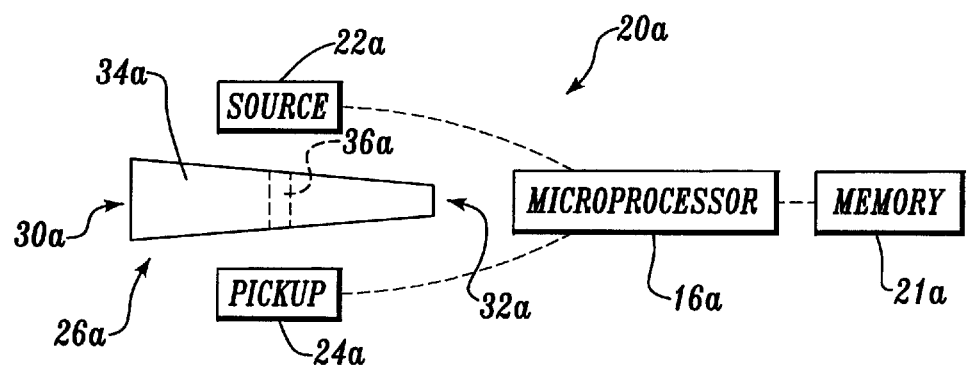
FIG. 4 is a schematic front elevational view of the display apparatus illustrated in FIG. 3.

FIGS. 3 and 4 illustrate a second and preferred embodiment of display 10a wherein interrupting body 26a is configured to interrupt different amounts of the source signal as indicator 13a is shifted across display 12a. This permits indicator position sensor 20a to sense the exact position of indicator 13a at all points across display 12a with a single source 22a and pickup 24a pair.

As best illustrated in FIG. 3, interrupting body 26a is preferably a partially opaque, wedge-shaped shield that extends across substantially the entire width of display 12a. Body 26a presents a pair of converging sidewalls 30a,32a and an interconnecting arcuate edge 34a.

Figure 5:
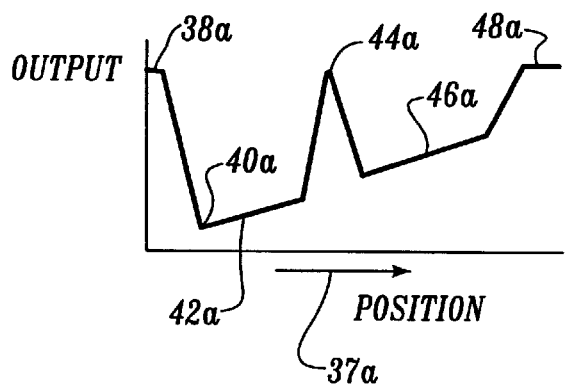
FIG. 5 is a graph illustrating a sample indicator position signal generated by the indicator position sensing means of the display apparatus illustrated in FIGS. 3 and 4.

The thickness of arcuate edge 34a tapers from sidewall 30a to sidewall 32a as illustrated in FIG. 5. In preferred forms, arcuate edge 34a is approximately 1/32" thick at sidewall 30a and approximately 1/10" thick at sidewall 34a. The midpoint of arcuate edge 34a includes a small hollow notch 36a formed therein.

Interrupting body 26a is operably coupled with the drive shaft of stepper motor 18a or the gear train driven by the drive shaft so that it pivots or shifts about the same axis as indicator 13a. In preferred forms, indicator 13a shifts across the upper portion of display 12a and body 26a shifts across the lower portion of display 12a. Body 26a may also be placed under display 12a so that it is hidden from view.

Source 22a and pickup 24a are positioned on opposite sides of body 26a so that body 26a passes between the source and pickup. As stepper motor 18a shifts indicator 13a and body 26a, different portions of body 26a are positioned between source 22a and pickup 24a.

Particularly, when stepper motor 18a pivots or shifts indicator 13a to its left-most position as indicated by arrow 36a in FIG. 3, it shifts body 26a to the right so that the portion of arcuate edge 34a near sidewall 30a is to the right of and not between source 22a and pickup 24a. Thus, body 26a does not block any of the source signal transmitted by source 22a, and pickup 24a generates a maximum indicator position signal. This portion of the indicator position signal, which is illustrated by the numeral 38a in FIG. 5, corresponds to the left-most position of indicator 13a relative to display 12a.

As stepper motor 18a shifts indicator 13a slightly to the right as viewed from FIG. 3, it also shifts the thickest portion of arcuate edge 34a near sidewall 30a leftward so that it is positioned between source 22a and pickup 24a. Body 26a then blocks all or most of the source signal transmitted by source 22a, and pickup 24a generates a low indicator position signal. This portion of the indicator position signal is illustrated by the numeral 40a in FIG. 5.

Then, as stepper motor 18a continues to shift indicator 13a to the right, it also continues to shift body 26a to the left so that the portion of arcuate edge 34a between source 22a and pickup 24a becomes progressively thinner. Thus, body 26a blocks less of the source signal, and pickup 24a generates a progressively larger indicator position signal. This portion of the indicator position signal is illustrated by the numeral 42a in FIG. 5.

Once stepper motor 18a shifts indicator 13a and body 26a to the midpoint of display 12a as illustrated in FIG. 3, notch 36a is positioned between source 22a and pickup 24a. Notch 36a blocks none of the source signal; therefore, pickup 24a once again generates a maximum indicator position signal. This portion of the indicator position signal, which is illustrated by the numeral 44a in FIG. 5, corresponds to the center position of indicator 13a relative to display 12a.

As stepper motor 18a continues to shift indicator 13a to the right as indicated by arrow 37a in FIG. 5, it also continues to shift body 26a to the left so that the portion of arcuate edge 34a between notch 36a and sidewall 32a once again blocks a portion of the source signal. Thus, pickup 24a once again generates a smaller position indication signal as illustrated by the numeral 46a in FIG. 5. However, since arcuate edge 34a is thinner near sidewall 32a than it is near sidewall 30a, the 46a portion of the signal is greater than the 42a portion of the signal.

Finally, when stepper motor 18a shifts indicator 13a to its right-most position as viewed from FIG. 3, it shifts body 26a completely to the left so that the portion of arcuate edge 34a next to sidewall 32a is to the left of and not between source 22a and pickup 24a. Thus, body 26a does not block any of the source signal transmitted by source 22a, and pickup 24a generates a maximum indicator position signal. This portion of the indicator position signal, which is illustrated by the numeral 48a in FIG. 5, corresponds to the right-most position of indicator 13a relative to display 12a.

With this configuration, indicator position sensor 20a and microprocessor 16a cooperate to locate the exact position of indicator 13a at all points across display 12a with a single source 22a and pickup 24a pair. Moreover, since the indicator position signal is at its maximum at the center, left and right edges of display 12a, these crucial indicator locations can be determined more accurately.

In both embodiments of the invention, pickup 24,24a continually transmits its indicator position signal to microprocessor 16,16a while stepper motor 18,18a shifts indicator 13,13a and interrupting body 26,26a across display 12,12a. Microprocessor 16,16a receives the indicator position signal and uses the signal to calibrate the control signal that it generates and transmits to stepper motor 18,18a.

When display apparatus 10,10a is initially aligned, the step counts of stepper motor 18, 18a that correspond to critical deflection points of indicator 13,13a are determined and stored in microprocessor 16,16a or memory 21,21a. For example, it may be determined that step count 10 corresponds to the left-most deflection point of indicator 13,13a, step count 30 corresponds to the center or zero deflection of indicator 13,13a, and step count 50 corresponds to the right-most deflection point of indicator 13,13a.

These step counts are stored in microprocessor 16,16a or memory 21,21a and used to control stepper motor 18,18a when microprocessor 16,16a receives a navigation signal from receiver 11 or other device. For example, if microprocessor 16, 16a receives a navigation signal that corresponds to the left-most deflection point of indicator 13,13a, microprocessor 16,16a directs stepper motor 18,18a to shift to a step count of 30.

During use, the alignment or linearity of display apparatus 10,10a may change. For example, the left-most, center and right-most deflection points of indicator 13,13a may change to step counts of 12,32, and 52, respectively. Indicator position sensor 20,20a senses these changes by sensing when indicator 13,13a actually passes the left-most, center, and right-most points on display 12,12a.

Pickup 24a then sends corresponding indicator position signals to microprocessor 16,16a representative of these indicator positions. Microprocessor 16,16a determines what step count of stepper motor 18, 18a is on when indicator 13,13a is at these deflection points and compares these step counts to the step counts previously determined during initial calibration. If the new step counts are different, microprocessor 16,16a calibrates stepper motor 18, 18a by replacing its previously stored step count numbers with these new step count numbers. Then, if microprocessor 16,16a receives a navigation signal that corresponds to the left-most, center, or center, or right-most deflection point of indicator 13,13a, it directs stepper motor 18,18a to shift to a step count of 12,32, or 52, respectively.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. A display apparatus for use with a parameter measuring device operable for measuring a parameter and for generating a parameter signal representative of the measured parameter, said display apparatus comprising:

a display including indicia representative of the parameter and a pair of opposed edges;

an indicator shiftable relative to said display;

control means responsive to the parameter measuring device for controlling the positioning of said indicator, said control means including processor means including receiving means for receiving the parameter signal from the parameter measuring device and generating means for generating a control signal representative of the parameter signal, shifting means coupled with said processor means and responsive to said control signal for shifting said indicator relative to said display to indicate the measured parameter, position sensing means for sensing the actual position of said indicator relative to said display and for generating a position signal representative of said actual position, said position sensing means including:

a source operable for transmitting a source signal, a pickup spaced from said source and operable for receiving said source signal and for generating said position signal in response thereto, and interrupting means coupled for movement with said indicator and configured for interrupting said source signal when said indicator passes said source and said pickup, said interrupting means including an interrupting body coupled with said shifting means for movement with said indicator between said edges of said display, said interrupting body including a first portion corresponding to one of said edges and configured for interrupting a first amount of said source signal when said indicator is shifted to said one edge and a second portion corresponding to the other of said edges and configured for interrupting a second amount of said source signal when said indicator is shifted to said other edge, and said processor means further including calibrating means for receiving said position signal and for calibrating said shifting means in response thereto.

2. The display apparatus as set forth in claim 1, said display further including a center position, said interrupting body further including a third portion corresponding to said center position and configured for interrupting a third amount of said source signal when said indicator is shifted to said center position.

3. In a display apparatus including a display having indicia representative of a measured parameter, an indicator shiftable relative to the display, and shifting means for shifting the indicator relative to the display for indicating the measured parameter, an indicator position detecting assembly comprising:

a pair of opposed edges included in said display;

position sensing means for sensing the actual position of said indicator relative to said display, said position sensing means including:

a source operable for transmitting a source signal, a corresponding pickup spaced from said source and operable for receiving said source signal, and interrupting means including an interrupting body coupled with said shifting means for movement with said indicator between said edges and configured for interrupting said source signal when said indicator passes said source and said pickup, said interrupting body including a first portion corresponding to one of said edges and configured for interrupting a first amount of said source signal when said indicator is shifted to said one edge and a second portion corresponding to the other of said edges and configured for interrupting a second amount of said source signal when said indicator is shifted to said other edge as said indicator is shifted relative to said display; and generating means for generating a position signal representative of said actual indicator position in response to said source signal.

4. The indicator position detecting assembly as set forth in claim 3, said display further including a center position, said interrupting body further including a third portion corresponding to said center position and configured for interrupting a third amount of said source signal when said indicator is shifted to said center position.

5. The indicator position detecting assembly of claim 3, wherein said position sensing means comprises an optical position sensor, said source is an optical transmitter, said pickup is an optical receiver, and said source signal is an optical signal.

6. The indicator position detecting assembly of claim 3, wherein said position sensing means comprises a mechanical position sensor.

7. The indicator position detecting assembly of claim 3, wherein said position sensing means comprises a magnetic position sensor, said source is a magnet, said pickup is a magnetic field sensor, and said source signal is a magnetic field.

8. A display apparatus for use with a parameter measuring device operable for measuring a parameter and for generating a parameter signal representative of the measured parameter, said display apparatus comprising:

a display with circular indicia representative of the parameter, said display further comprises a center position;

an indicator rotatably mounted on the display relative to said circular indicia; and control means for controlling the positioning of said indicator according to the generated parameter signal, wherein said control means further comprises:

processor means for generating a control signal according to the generated parameter signal;

rotating means for rotating said indicator relative to said circular indicia on said display according to said generated parameter signal in order to identify the measured parameter; and position sensing means for sensing the actual position of said indicator relative to said circular indicia on said display and for generating a position signal according to said sensed actual position, said position sensing means further comprising:
a source operable for transmitting a source signal;
a pickup spaced from said source for receiving said source signal and for generating said position signal in response thereto; and
interrupting means coupled to said indicator for interrupting said source signal when said indicator is rotated, said interrupting means comprising a first portion for interrupting a first amount of said source signal when said indicator is rotated in a first circular direction, a second portion for interrupting a second amount of said source signal when said indicator is rotated in a second circular direction and a third portion corresponding to said center position for interrupting a third amount of said source signal when said indicator is rotated to be co-located with said center position;
wherein said processor means further comprises calibrating means for receiving said position signal and for calibrating said rotating means in response thereto.

9. The display apparatus of claim 8, wherein said processor means further comprises a microprocessor for driving said rotating means according to the generated parameter signal from the parameter measuring device.

10. The display apparatus of claim 9, wherein said rotating means further comprises a motor coupled between said indicator and said microprocessor for rotating said indicator relative to said display in response to said control signal.

11. The display apparatus of claim 8, wherein said position sensing means further comprises an optical position sensor, said source is an optical transmitter, said pickup is an optical receiver, and said source signal is an optical signal.

12. The display apparatus of claim 8, wherein said position sensing means further comprises an infrared position sensor, said source is an infrared transmitter, said pickup is an infrared receiver, and said source signal is an infrared signal.

13. The display apparatus of claim 8, wherein said position sensing means further comprises a mechanical position sensor.

14. The display apparatus of claim 8, wherein said position sensing means further comprises a magnetic position sensor, said source is a magnet, said pickup is a magnetic field sensor, and said source signal is a magnetic field.

15. A display apparatus for use with a parameter measuring device for measuring a parameter and for generating a parameter signal according to the measured parameter, said display apparatus comprising:
a display comprising indicia representative of the parameter and a pair of opposed edges;
an indicator shiftable relative to said display; and
control means responsive to the parameter measuring device for controlling the positioning of said indicator, said control means comprising:
processor means for receiving the parameter signal from the parameter measuring device and for generating a control signal representative of the parameter signal;
shifting means coupled with said processor means and responsive to said control signal for shifting said indicator relative to said display to indicate the measured parameter; and
position sensing means for sensing the actual position of said indicator relative to said display and for generating a position signal representative of said actual position, said position sensing means comprising:
a source for transmitting a source signal;
a pickup spaced from said source for receiving said source signal and for generating said position signal in response thereto; and
interrupting means coupled to said indicator for interrupting said source signal when said indicator passes said source and said pickup, said interrupting means comprises an interrupting body coupled with said shifting means for movement with said indicator between said edges of said display, said interrupting body comprising a first portion corresponding to one of said edges and configured for interrupting a first amount of said source signal when said indicator is shifted to said one edge and a second portion corresponding to the other of said edges and configured for interrupting a second amount of said source signal when said indicator is shifted to said other edge;
wherein said processor means further comprises calibrating means for receiving said position signal and for calibrating said shifting means in response thereto.

16. The display apparatus of claim 15, wherein said processor means further comprises a microprocessor for driving said shifting means according to the generated parameter signal from the parameter measuring device.

17. The display apparatus of claim 16, wherein said shifting means further comprises a motor coupled between said indicator and said microprocessor for shifting said indicator relative to said display in response to said control signal.

18. The display apparatus of claim 15, wherein said display further comprises a center position, and said interrupting body further comprises a third portion corresponding to said center position and configured for interrupting a third amount of said source signal when said indicator is shifted to be co-located with said center position.

19. The display apparatus of claim 15, wherein said position sensing means further comprises an optical position sensor, said source is an optical transmitter, said pickup is an optical receiver, and said source signal is an optical signal.

20. The display apparatus of claim 15, wherein said position sensing means further comprises an infrared position sensor, said source is an infrared transmitter, said pickup is an infrared receiver, and said source signal is an infrared signal.

21. The display apparatus of claim 15, wherein said position sensing means further comprises a mechanical position sensor.

22. The display apparatus of claim 15, wherein said position sensing means further comprises a magnetic position sensor, said source is a magnet, said pickup is a magnetic field sensor, and said source signal is a magnetic field.

23. In a display apparatus comprising a display having indicia representative of a measured parameter, an indicator rotatable relative to the display, and rotating means for rotating the indicator relative to the display for indicating the measured parameter, an indicator position detecting assembly comprising:
a pair of opposed edges included in said display;
position sensing means for sensing the actual position of said indicator relative to said display, said position sensing means comprising:

a source operable for transmitting a source signal;

a corresponding pickup spaced from said source and operable for receiving said source signal; and interrupting means comprising an interrupting body coupled with said rotating means for movement with said indicator between said edges and configured for interrupting said source signal when said indicator passes said source and said pickup, said interrupting body comprising a first portion corresponding to one of said edges and configured for interrupting a first amount of said source signal when said indicator is rotated to said one edge and a second portion corresponding to the other of said edges and configured for interrupting a second amount of said source signal when said indicator is rotated to said other edge as said indicator is rotated relative to said display; and generating means for generating a position signal representative of said actual indicator position in response to said source signal.

24. The indicator position detecting assembly of claim 23, wherein said display further comprises a center position, and said interrupting body further comprises a third portion corresponding to said center position and configured for interrupting a third amount of said source signal when said indicator is rotated to be co-located with said center position.

25. The indicator position detecting assembly of claim 23, wherein said position sensing means comprises an optical position sensor, said source is an optical transmitter, said pickup is an optical receiver, and said source signal is an optical signal.

26. The indicator position detecting assembly of claim 23, wherein said position sensing means comprises a mechanical position sensor.

27. The indicator position detecting assembly of claim 23, wherein said position sensing means comprises a magnetic position sensor, said source comprises a magnet, said pickup is a magnetic field sensor, and said source signal is a magnetic field.

* * * * *